United States Patent [19]

Hasegawa et al.

[11] Patent Number: 5,142,136
[45] Date of Patent: Aug. 25, 1992

[54] METHOD AND SYSTEM FOR DRIVING A SOLID-STATE IMAGING DEVICE

[75] Inventors: Yasumasa Hasegawa; Tetsuo Tome, both of Kanagawa; Kazuya Oda; Masahiro Konishi, both of Tokyo, all of Japan

[73] Assignee: Fuji Photo Film Co., Ltd., Kanagawa, Japan

[21] Appl. No.: 660,890

[22] Filed: Feb. 26, 1991

[30] Foreign Application Priority Data

Feb. 27, 1990 [JP] Japan ................................ 2-44572

[51] Int. Cl.[5] ............................................. H01J 40/14
[52] U.S. Cl. ............................ 250/208.1; 250/231.16
[58] Field of Search ........... 250/208.1, 231.16, 231.18; 357/30 H; 358/213.19, 213.24, 213.26, 213.28

[56] References Cited

U.S. PATENT DOCUMENTS 4,740,824  4/1988  Yano et al. ...................... 357/30 H
5,019,702  5/1991  Ohzu et al. ...................... 250/208.1

Primary Examiner—David C. Nelms
Assistant Examiner—T. Davenport

[57] ABSTRACT

A method and system is provided for driving a charge-coupled solid-state interline imaging device which removes smear components and dark current to prevent flicker in the imaging device. The drive method and apparatus controls the drive signals so that the transfer elements of the imaging device are uniform while an optical image is being exposed. Also, a dummy scanning transfer operation is performed to the vertical and horizontal charge transfer paths after the exposure. Furthermore, the potential levels of the vertical charge transfer paths may be set to an equal level. As a result, the smear components on the vertical charge transfer paths are uniform so that the flicker in the reproduced optical image is significantly reduced.

18 Claims, 6 Drawing Sheets

METHOD AND SYSTEM FOR DRIVING A SOLID-STATE IMAGING DEVICE

TECHNICAL FIELD OF THE INVENTION

The present invention relates to a method and system for driving a charge-coupled solid-state imaging device of an interline transfer type.

DESCRIPTION OF THE RELATED ART

Conventionally, a charge-coupled solid-state imaging device has a circuit structure as illustrated in FIG. 10. Specifically, the device is fabricated by semiconductor integrated circuit technology to have a light receiving region including a plurality of photodiodes PDA and PDB in a matrix form having a row direction (vertical in FIG. 10) and in a column direction (horizontal in FIG. 10) with a vertical charge transfer path (1 to m) formed adjacent to a group of photodiodes arranged to each column.

On the surface of each of the vertical charge transfer paths 1 to m, transfer electrodes G1, G2, G3 and G4 are laminated, each of which is made of a polysilicon layer. The transfer electrode G1 receives a drive signal $\Phi_{V1}$; the transfer electrode G2 receives a drive signal $\Phi_{V2}$; the transfer electrode G3 receives a drive signal $\Phi_{V3}$; and the transfer electrode G4 receives a drive signal $\Phi_{V4}$. The voltage level of each of these drive signals $\Phi_{V1}$ to $\Phi_{V4}$ is changed in synchronism with a predetermined timing to generate a potential well (hereinafter referred to as a "transfer element") and a potential barrier along each of the vertical charge transfer paths 1 to m for transferring the charges.

Each of the transfer electrodes G1 and G2 generates a transfer element or a potential barrier at a position confronting the photodiode PDA, while each of the transfer electrodes G3 and G4 generates a transfer element or a potential barrier at a position confronting the photodiode PDB. The transfer electrodes designated by the same reference character are commonly connected. Between each photodiode PDA and the portion below the transfer electrode G2 of each vertical charge transfer path adjacent to the photodiode PDA is a transfer gate Tg1 (reference character Tg1 is illustrated in FIG. 10), which has a terminal of the transfer electrode G2 as a gate electrode. This transfer gate Tg1 conducts only when a high voltage field shift signal is applied to the transfer electrode G2. Between each photodiode PDB and the portion below the transfer electrode G4 of each vertical change transfer path adjacent to the photodiode PDB is a transfer gate Tg2 (reference character Tg2 is illustrated in FIG. 10), which has a terminal of the transfer electrode G4 as a gate electrode. This transfer gate Tg2 conducts only when a high voltage field shift signal is applied to the transfer electrode G4.

The pixel signal generated at each photodiode PDA arranged at an odd row is defined as an odd field of an image and the pixel signal generated at each photodiode PDB arranged at an even row is defined as an even field of the image.

A horizontal charge transfer path HCCD is connected to a terminal portion of each of the vertical charge transfer paths 1 to m in the light receiving region thus constructed, and a terminal portion of the horizontal charge transfer path HCCD is provided with an output amplifier AMP.

The horizontal charge transfer path HCCD reads the pixel signals on a point-sequential basis from the output amplifier AMP by transferring signal charges in synchronism with drive signals $\Phi_{H1}$ and $\Phi_{H2}$, each applied at a predetermined timing.

A case where the solid-state imaging device thus operated is applied to an electronic still camera will be described. The electronic still camera has an imaging optical system including an imaging lens, a shutter mechanism, and a diaphragm mechanism, in front of the light receiving region of the solid-state imaging device. At the time of imaging, the shutter mechanism is opened for an appropriate interval of time for exposure. As a result, the electronic still camera causes the photodiodes PDA and PDB to receive the optical image that has passed through the imaging optical system during this exposure interval. Thereafter, the pixel signal stored at each photodiode PDA corresponding to the odd field is read through the vertical charge transfer paths 1 to m and the horizontal charge transfer path HCCD. Subsequentially, the pixel signal stored at each photodiode PDB corresponding to the even field is read through the vertical charge transfer paths 1 to m and the horizontal charge transfer path HCCD.

The above imaging operation will be described in more detail with reference to the timing chart illustrated in FIG. 11. In FIG. 11, the drive signals $\Phi_{V1}$ to $\Phi_{V4}$ conform to a four-phase drive system. A period TA designates an odd field scanning period for reading the pixel signal generated at each photodiode PDA corresponding to the odd field and a period TB designates an even field scanning period for reading the pixel signal generated at each photodiode PDB corresponding to the even field. The period TF in which both periods TA and TB are combined is a frame scanning period for reading the pixel signals equivalent to a single frame.

If a shutter release button is pressed by an operator at a certain time $t_0$, an optical image is exposed for a predetermined interval (the interval from time $t_0$ to time $t_1$ in which a signal ST is high) equivalent to a shutter speed in synchronism therewith. This exposing operation is performed when the vertical charge transfer paths 1 to m continue their normal transfer operation. In other words, the exposing operation is performed when the drive signals $\Phi_{V1}$ and $\Phi_{V2}$ are high and the drive signals $\Phi_{V3}$ and $\Phi_{V4}$ are low as illustrated in FIG. 11. In FIG. 11, transfer elements are generated below the transfer electrodes G1 and G2 corresponding to the photodiodes PDA, which further correspond to the odd field, while potential barriers are generated below the remaining transfer electrodes G3 and G4, in each of the vertical charge transfer paths 1 to m.

Upon completion of the exposure, the drive signal $\Phi_{V2}$ is set to a high voltage "HH" level at a predetermined time $t_2$ when the vertical synchronizing signal VD is low (corresponding to a horizontal blanking interval in a standard television system). As a result, the pixel signal generated at each photodiode PDA corresponding to the odd field is field-shifted to the transfer element below each transfer electrode G2. The "HH" level signal portion corresponds to the field shift signal.

When the vertical synchronizing signal VD is low, the voltage level of each of the drive signals $\Phi_{V1}$ to $\Phi_{V4}$ is changed in conformity to the predetermined four-phase drive system. As a result, the pixel signals corresponding to the odd field are transferred globally by each of the vertical charge transfer paths 1 to m toward the horizontal charge transfer path HCCD for every one horizontal line. Accordingly, the pixel signals equivalent to a first one horizontal line are transferred to the horizontal charge transfer path HCCD.

Successively, when the vertical synchronizing signal VD is high (from time $t_3$ to time $t_4$, the horizontal charge transfer path HCCD sequentially transfers the pixel signals in synchronism with the drive signals $\Phi_{H1}$ and $\Phi_{H2}$ conforming to a two-phase drive system. As a result, the pixel signals are read chronologically in synchronism with the timing of each of the drive signals $\Phi_{H1}$ and $\Phi_{H2}$.

The same operation as the operation from time $t_2$ to time $t_4$ excluding the operation by the above-described field shift signal is repeated until all the pixel signals corresponding to the odd field are read.

Upon completion of such an odd field scanning operation (at time $t_5$), an even field scanning operation will be started. First, the drive signals $\Phi_{V1}$ to $\Phi_{V4}$ are changed in conformity to the four-phase drive system in synchronism with the vertical synchronizing signal VD, and at time $t_6$ when the drive signal $\Phi_{V4}$ is high, the field shift signal having the "HH" level voltage is superimposed over the drive signal $\Phi_{V4}$. As a result, the pixel signal corresponding to the even field is field-shifted to the transfer element below each transfer electrode G4 from each photodiode PDB.

Successively, when the vertical synchronizing signal VD is high (from time $t_7$ to time $t_8$), the horizontal charge transfer path HCCD sequentially transfers the pixel signals in synchronism with the drive signals $\Phi_{H1}$ and $\Phi_{H2}$ conforming to the two-phase drive system. As a result, the pixel signals are read chronologically in synchronism with the timing of each of the drive signals $\Phi_{H1}$ and $\Phi_{H2}$. The same operation as the operation from time $t_5$ to time $t_8$ excluding the operation by the above-described field shift signal is repeated until all the pixel signals corresponding to the even field are read (at time $t_9$).

Such conventional methods of driving the solid-state imaging device, however, allow unnecessary charge such as smear components remaining in the vertical charge transfer paths to be introduced into the pixel signals at the time when a first odd field scanning operation is performed which causes the unnecessary charge to act as an offset on the one hand. When the subsequent even field scanning operation is performed, on the otherhand, the pixel signals are read with the unnecessary charge removed which reduces the unnecessary charge. As a result, if the optical image is reproduced by an image reproducing device of an interlace scanning system using these pixel signals, the degree of effect from the unnecessary charge on the pixel signals corresponding to the odd field differs from that on the pixel signals corresponding to the even field which thereby causes flicker.

The major causes of the unnecessary charge generated in the solid-state imaging device include: smear components including essentially components induced by the light injected into the substrate by irregular reflection from the part other than a shielding layer in the receiving region; components induced by the light injected into the substrate while passing through the shielding layer; and components induced in the substrate by the light that has reached the deepest layer portion of the photodiode; and a dark current regularly generated from the substrate. The field flicker is caused when the unnecessary charge is introduced into the already field-scanned pixel signals.

To prevent the field flicker from being caused, a technique of interposing a so-called "dummy scanning transfer operation" has been employed. The dummy scanning transfer operation involves the steps of discharging the unnecessary charge to the vertical and horizontal charge transfer paths between the exposure end and the odd field scanning start and performing a normal field scanning operation thereafter. Specifically, in FIG. 11, the dummy scanning transfer operation is performed between the exposure end time $t_1$ and the field scanning start time $t_2$. This technique reduces the adverse effect of the unnecessary charge on the pixel signals corresponding to the odd field which develops a reproduced image having less field flicker.

Because conventional techniques are effective in reducing the field flicker but do not sufficiently reduce the field flicker, an improved technique for obtaining a reproduced image having still less field flicker has been called for.

SUMMARY OF THE INVENTION

An object of the present invention is to provide a method and system for driving a solid-state imaging device capable of preventing flicker by removing the adverse effect of components such as smear and a dark current present in the solid-state imaging device.

To achieve the above object, the present invention is directed to a method of driving a charge-coupled solid-state imaging device of an interline transfer type which has a light receiving region including a plurality of photoelectric conversion elements, with each element corresponding to a pixel, arranged in rows and columns in a matrix form, a plurality of vertical charge transfer paths, with each vertical charge transfer path extending so as to be adjacent to a group of photoelectric conversion elements arranged in each column, and a horizontal charge transfer path arranged at an output portion of the vertical charge transfer paths. A group of photoelectric conversion elements arranged at every odd row forms an odd field while a group of photoelectric conversion element arranged at every even row forms an even field. Such a charge-coupled solid-state imaging device is driven to scan the pixel signals of a group of photoelectric conversion elements corresponding to either one of the fields through the vertical charge transfer paths and the horizontal charge transfer path. Subsequently, the pixel signals of a group of photoelectric conversion elements corresponding to the other field through the vertical charge transfer paths and the horizontal charge transfer path are scanned so that all of the pixel signals are read.

In such a driving method for an embodiment of the present invention, drive signals are controlled in such a manner that the potential levels of the transfer elements for all of the vertical charge transfer paths will be made uniform while the optical image is being exposed and that a field scanning operation is started upon completion of the exposure.

Another embodiment of the present invention controls the drive signals in such a manner that the potential levels of all of the vertical charge transfer paths are made uniform while the optical image is being exposed, that the vertical and horizontal charge transfer paths perform a so-called dummy scanning transfer operation after the exposure, and that the field scanning operation is started thereafter.

Still another embodiment of the present invention adjusts the potential levels of all of the vertical charge transfer paths to a level equal to or to a uniform shallow level greater than the potential level of a potential barrier, when the potential levels of all of the vertical charge transfer paths are made uniform while the optical image is being exposed.

Still another embodiment of the present invention adjusts the potential levels of all of the vertical charge transfer paths to a level equal to the potential level of a transfer element or to an appropriately uniform level, when the potential levels of all of the vertical charge transfer paths are made uniform while the optical image is being exposed.

According to the drive control methods for the embodiments of the present invention, all the potential levels of the vertical charge transfer paths are kept constant while the optical image is being exposed by each photoelectric conversion element corresponding to a pixel so that the adverse effect of the smear components on all of the vertical charge transfer paths are uniform. It is under such a uniform condition that the field scanning operation is performed in a manner similar to the conventional operation. This makes the effect of the smear uniform on the odd and even fields. As a result, the flicker in the reproduced image is significantly reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
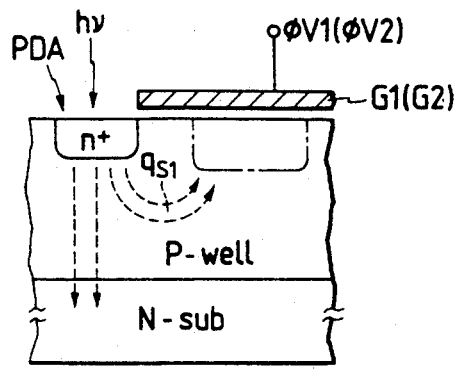
FIGS. 1 and 2 illustrate the smear components at cross-sections of photodiodes PDA and PDB along the lines x1—x1 or x2—x2 and x3—x3 or x4—x4 in FIG. 10 corresponding to odd and even fields respectively by a conventional driving method.
Figure 2:
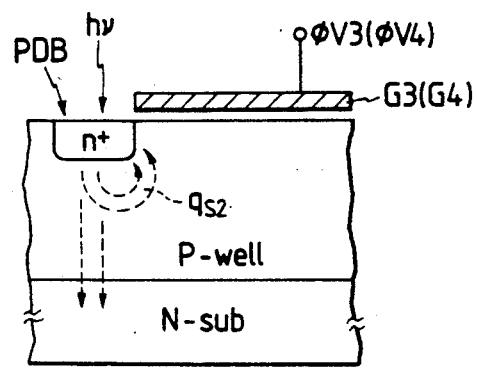
Figure 3:
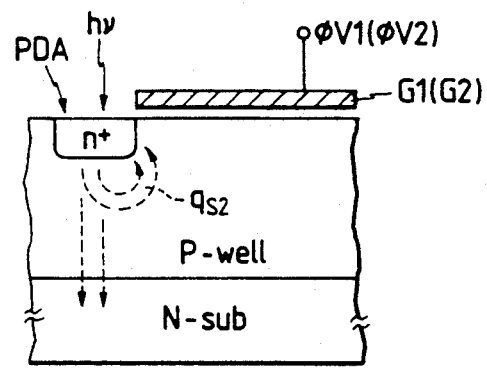
FIGS. 3 and 4 illustrate the smear components of photodiodes PDA and PDB along the lines x1—x1 or x2—x2 and x3—x3 or x4—x4 in FIG. 10 corresponding to odd and even fields respectively by a driving method for an embodiment of the present invention.
Figure 4:
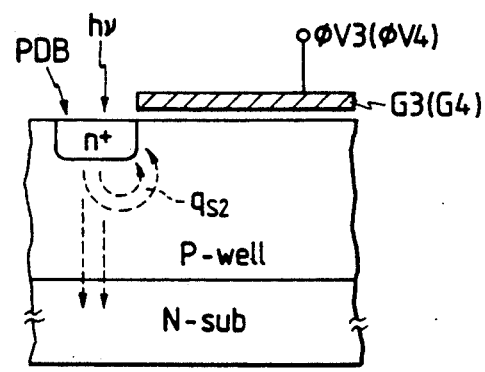
Figure 5:
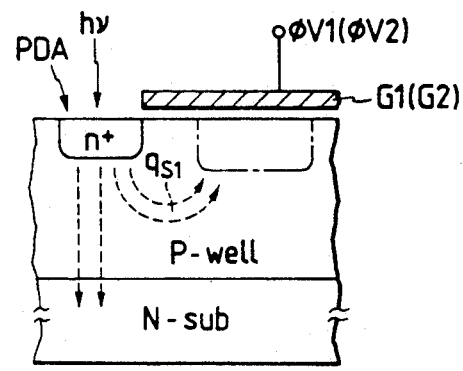
FIGS. 5 and 6 illustrate the smear components of photodiodes PDA and PDB along the lines x1—x1 or x2—x2 and x3—x3 or x4—x4 in FIG. 10 corresponding to odd and even fields respectively by a driving method for another embodiment of the present invention.
Figure 6:
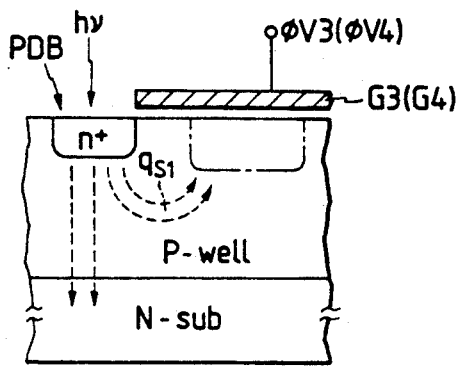

The embodiments of the present invention will now be described with reference to FIGS. 1 and 6. The solid-state imaging device has a circuit structure similar to the conventional circuit structure illustrated in FIG. 10. FIGS. 1, 3, and 5 are sectional views each illustrating the vicinity of a photodiode PDA corresponding to an odd field taken along the line x1—x1 or the line x2—x2 illustrated in FIG. 10. FIGS. 2, 4, and 6 are sectional views illustrating the vicinity of a photodiode PDB corresponding to an even field taken along the line x3—x3 or the line x4—x4 illustrated in FIG. 10. FIGS. 1 and 2 are presented to describe the conventional cause of the flicker, illustrating an exemplary state that the drive signals to be applied to the transfer electrodes G1 to G4 during the exposure are set to: $\Phi_{V1}=H$, $\Phi_{V2}=H$, $\Phi_{V3}=L$, and $\Phi_{V4}=L$ as illustrated in FIG. 11. FIGS. 3 to 6 are presented to describe the flicker reduction according to the present invention.

The conventional cause of the flicker will be described first with reference to FIGS. 1 and 2. As illustrated in FIG. 11, when the drive signal levels are set to: $\Phi_{V1}=H$, $\Phi_{V2}=H$, $\Phi_{V3}=L$, and $\Phi_{V4}=L$, a transfer element with such a deep potential level as illustrated in FIG. 1 is generated below the transfer electrode G1 or G2 in the vertical charge transfer path adjacent to the photodiode PDA corresponding to the odd field, and a potential barrier is generated below the transfer electrode G3 or G4 in the vertical charge transfer path adjacent to the photodiode PDB corresponding to the even field as illustrated in FIG. 2.

In the case of FIG. 1, a portion of the smear components escapes into the substrate, while the remainder of the smear components (designated by $q_{S1}$ in FIG. 1) moves to the transfer element for storage. In the case of FIG. 2, a portion of the smear components escapes into the substrate, while the remainder of the smear components (designated by $q_{S2}$ in FIG. 2) is retained around the photodiode and introduced into the pixel signal because the potential barrier has been generated at the vertical charge transfer path. As a result, the smear components move in the semiconductor substrate differently between the odd field and the even field.

Even if the unnecessary charge is discharged by performing the conventional dummy scanning transfer operation, and the field scanning operation is performed thereafter, introduction of the smear components $q_{S1}$ into the pixel signal corresponding to the odd field illustrated in FIG. 1 can be checked. However, introduction of the smear components $q_{S2}$ into the pixel signal corresponding to the even field illustrated in FIG. 2 cannot be prevented which causes flicker in the reproduced image.

Specifically, the flicker attributable to the introduction of the smear components into the pixel signal in the photodiode as illustrated in FIG. 2 cannot be prevented by the conventional drive method.

In contrast thereto, the embodiments of the present invention make the potential levels for all of the vertical charge transfer paths uniform during the exposure. This makes the field scanning condition in both the odd and even fields equal so that the unnecessary charge such as the smear components on the pixel signals are uniform.

FIGS. 3 and 4 illustrate the case where the potential levels for all of the vertical charge transfer paths are set to a shallow level equal to the potential barrier. Specifically, the smear components are not introduced into the vertical charge transfer paths corresponding to the odd and even fields (FIGS. 3 and 4) but the smear components $q_{S2}$ are introduced uniformly into the photodiodes corresponding to the respective fields. Therefore, the offset levels of the pixel signals outputted by the field scanning operation are made uniform for every field which greatly reduces the flicker. Further, the absolute value of the smear components $q_{S2}$ introduced into the pixel signal by returning back to the photodiode is so small that the field scanning operation can be started upon completion of the exposure without performing the conventional dummy scanning transfer operation which advantageously allows a high-speed imaging operation as well.

FIGS. 5 and 6 illustrate the case where the potential levels of all the vertical charge transfer paths are set to a level equal to the transfer element or to a level that is appropriately deep. Specifically, the smear components $q_{S1}$ are uniformly introduced into both the vertical charge transfer path (FIG. 5) corresponding to the odd field and the vertical charge transfer path (FIG. 6) corresponding to the even field. Therefore, the offset levels of the pixel signals outputted by the field scanning operation are made uniform for every field which greatly reduces the flicker. However, the vertical charge transfer paths are set to a uniform potential level that is comparatively deep and the smear components $q_{S1}$ are introduced into a vertical charge transfer paths in large amounts. In this case, it is effective to perform the field scanning operation after the conventional dummy scanning transfer operation has been performed upon the end of the exposure, so that an increased dynamic range can be obtained.

Figure 7:
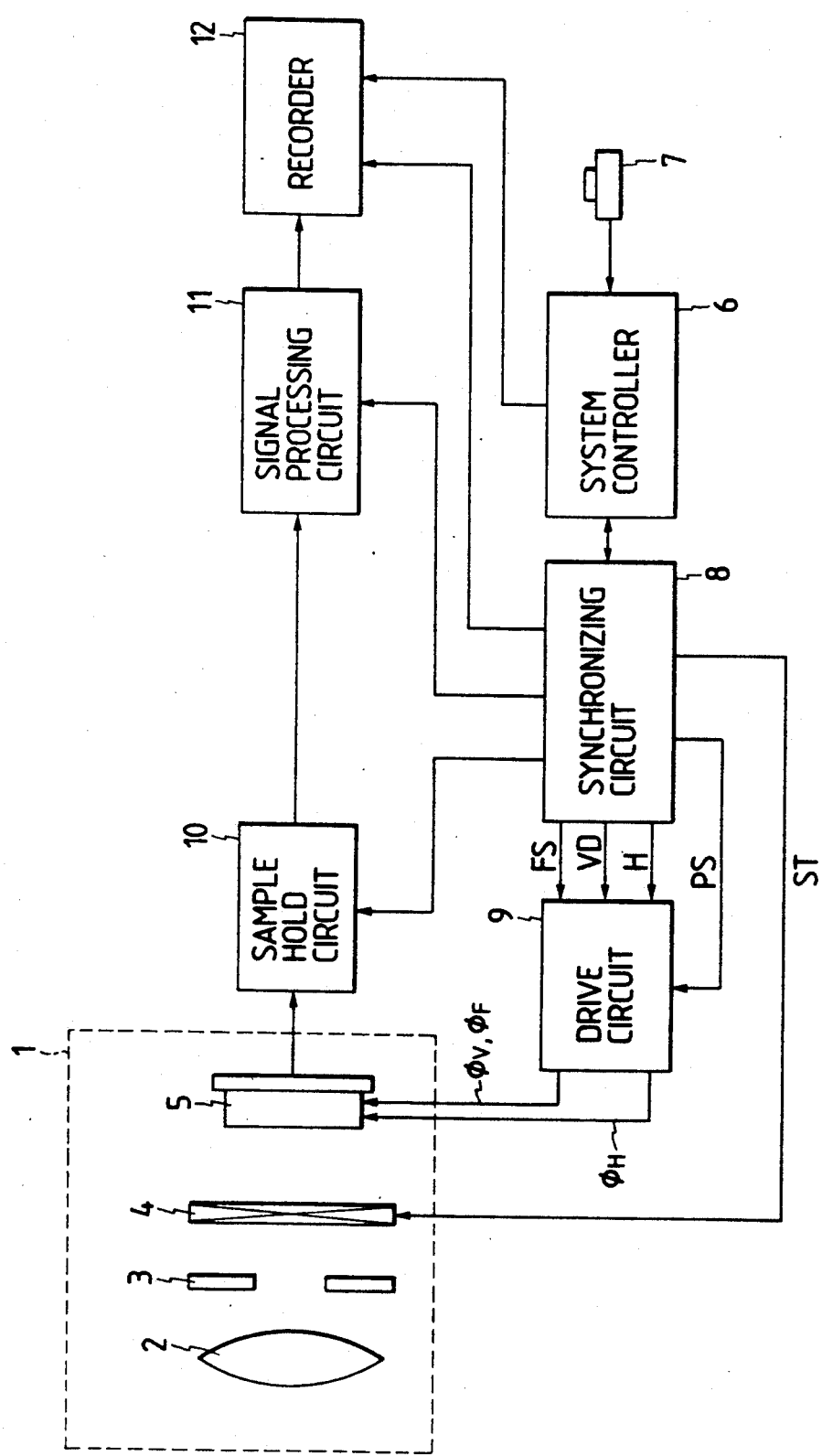
FIG. 7 illustrates an electronic still camera for an embodiment of the present invention.

A method of driving a solid-state imaging device according to an embodiment of the present invention will be described with reference to the accompanying drawings. The construction of an electronic still camera to which the invention is applied will be described first with reference to FIG. 7. In FIG. 7, reference numeral 1 designates an imaging optical system including an imaging lens 2, a diaphragm mechanism 3, a mechanical shutter mechanism 4 and a charge-coupled solid-state imaging device 5. Each of these components is arranged along the optical axis of the imaging optical system. The charge-coupled solid-state imaging device 5 has a structure similar to the structure illustrated in FIG. 10.

Reference numeral 6 designates a system controller including a microprocessor. This system controller is in charge of controlling the entire operation timings of the camera and also of starting the imaging operation in synchronism with the timing of pressing a shutter release button 7.

Reference numeral 8 designates a synchronizing signal generating circuit, which generates various synchronizing signals for operating the camera in synchronism with a predetermined reference clock signal.

Reference numeral 9 designates a drive circuit, which generates signals such as a drive signal $\Phi_V$ for driving the vertical charge transfer paths in the charge-coupled solid-state imaging device 5 in synchronism with a vertical synchronizing signal VD supplied from the synchronizing signal generating circuit 8, a drive signal $\Phi_H$ for driving the horizontal charge transfer path in synchronism with a horizontal synchronizing signal H, and a field shift signal $\Phi_F$ which synchronizes with a synchronizing signal FS triggering a field shifting operation timing.

Reference numeral 10 designates a sample hold circuit, which sample-holds the pixel signals outputted from the charge-coupled solid-state imaging device 5 at a point-sequential read timing that synchronizes with the drive signals $\Phi_V$ and $\Phi_H$.

Reference numeral 11 designates a signal processing circuit, which subjects the pixel signals outputted from the sample hold circuit 10 to white balance adjustment, $\gamma$ correction, and similar operations and further converts the signals thus processed into recordable signals.

Reference numeral 12 designates a recording section, which records the recordable signals outputted from the signal processing circuit 11 into a recording medium such as a magnetic recording medium.

Figure 8:
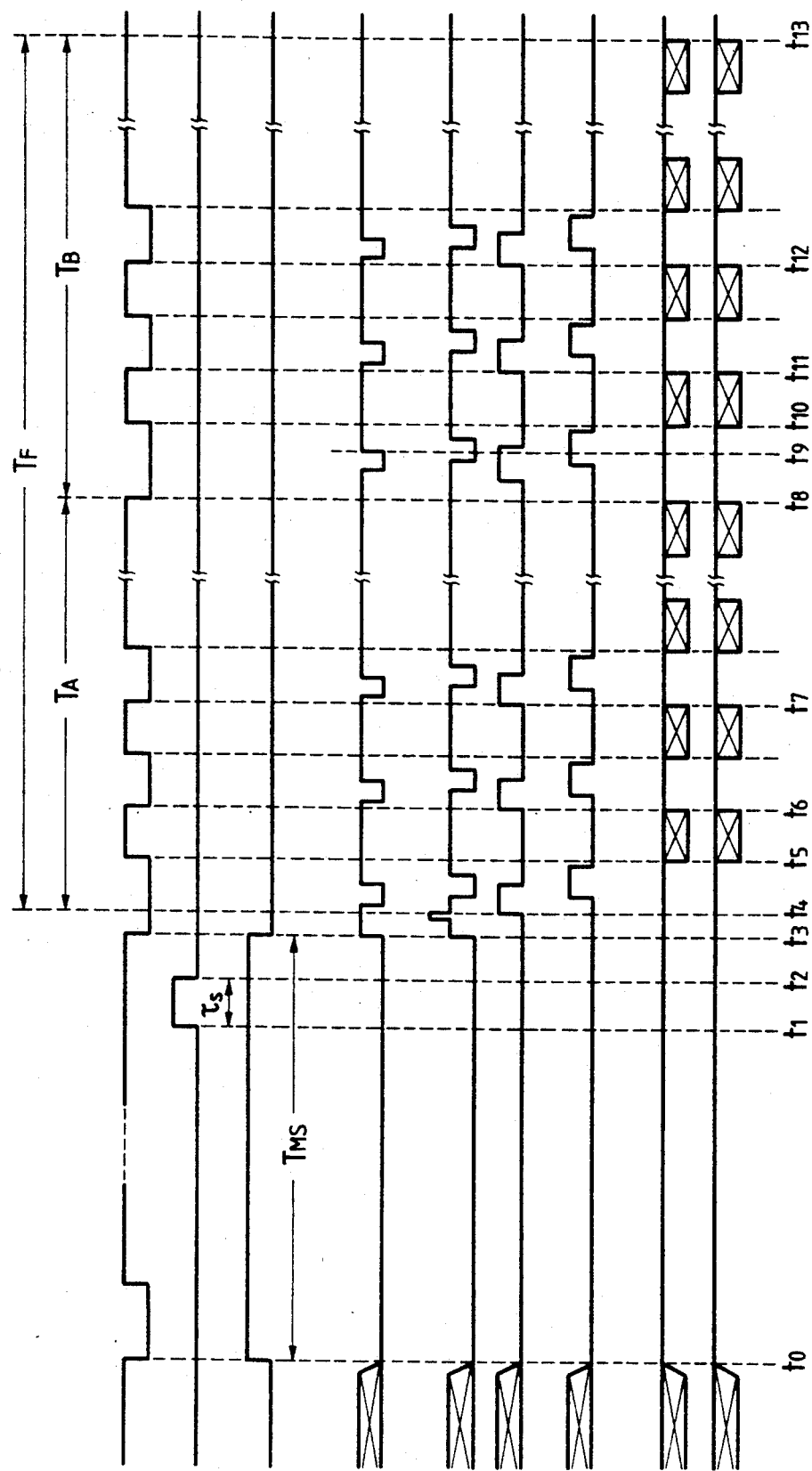
FIGS. 8 illustrates the timing chart of a driving method for an embodiment of the present invention.

An operation of the camera thus constructed will be described with the timing chart illustrated in FIG. 8. In FIG. 8, reference character VD designates a vertical synchronizing signal, and the period in which the signal VD is high corresponds to a horizontal scanning period while the period in which the signal VD is low corresponds to a horizontal blanking interval. Reference character ST designates an exposure interval when the interval ST is high. Reference character PS designates a mask period (described later) when the period PS is high. Reference characters $\Phi_{V1}$ to $\Phi_{V4}$ designate drive signals to be applied to the transfer electrodes of each vertical charge transfer path (illustrated by $\Phi_V$ in FIG. 7), and these drive signals conform to a four-phase drive system in the present embodiment. Reference characters $\Phi_{H1}$ and $\Phi_{H2}$ designate drive signals for driving the horizontal charge transfer path (illustrated by $\Phi_H$ in FIG. 7), and these drive signals conform to a two-phase drive system in the present embodiment.

When the shutter release button 7 has been pressed at a certain timing, at time $t_0$ in which the vertical synchronizing signal VD goes low immediately after pressing the shutter release button 7, the mask signal PS that has been supplied from the synchronizing signal generating circuit 8 to the drive circuit 9 goes high. When the mask signal PS is high, the drive signals $\Phi_{V1}$ to $\Phi_{V4}$ to each of the Vertical charge transfer paths 1 to m are masked, thereby forcibly setting all these drive signals to go low. The shutter signal ST goes high only during an interval $t_s$ equivalent to a shutter speed after a predetermined time from when the mask signal PS went high. That is, the shutter mechanism 4 is opened only for this interval $t_s$ for exposure.

When the shutter signal ST goes low upon the end of the exposure (at time $t_2$), the mask signal PS goes low in synchronism with the vertical synchronizing signal VD which goes low (at time $t_3$). As a result, the drive signals $\Phi_{V1}$ to $\Phi_{V4}$ are unmasked, causing the normal operation to be resumed in synchronism with the vertical synchronizing signal VD.

When the vertical synchronizing signal VD is low (from time $t_3$ to time $t_5$), each of the vertical charge transfer paths 1 to m performs a transfer operation in synchronism with the drive signals $\Phi_{V1}$ to $\Phi_{V4}$, and when the drive signal $\Phi_{V2}$ is high at time $t_4$, a high voltage field shift signal $\Phi_F$ for field shifting the pixel signals is superimposed thereover. As a result, the pixel signals of the photodiodes PDA corresponding to the odd field are field-shifted and globally transferred toward the horizontal charge transfer path HCCD. Thus, pixel signals equivalent to one row of photodiodes located nearest to the horizontal charge transfer path HCCD are transferred to the horizontal charge transfer path HCCD.

When the vertical synchronizing signal VD is high (from time $t_5$ to time $t_6$), the horizontal charge transfer path HCCD horizontally transfers the pixel signals in synchronism with the drive signals $\Phi_{H1}$ and $\Phi_{H2}$ conforming to the two-phase drive system, and the transferred pixel signals are outputted chronologically through the output amplifier AMP.

Upon completion of reading the pixel signals equivalent to the one row, the same operation as from time $t_3$ to time $t_6$ excluding the operation by the field shift signal $\Phi_F$ is performed from time $t_6$ to time $t_7$, thereby reading the pixel operation is repeated until all the pixel signals corresponding to the odd field are read.

Upon completion of reading all the pixel signals corresponding to the odd fields at time $t_8$, the operation of reading the pixel signals corresponding to the even field is started.

Specifically, when the vertical synchronizing signal VD is low (from time $t_8$ to time $t_{10}$), each of the vertical charge transfer paths 1 to m performs a transfer operation in synchronism with the drive signals $\Phi_{V1}$ to $\Phi_{V4}$; and when the drive signal $\Phi_{V4}$ is high at time $t_9$, a high voltage field shift signal $\Phi_F$ for field sifting is superimposed thereover. As a result, the pixel signals of the photodiodes PDB corresponding to the even field are field-shifted and globally transferred toward the horizontal charge transfer path HCCD. Thus, pixel signals equivalent to one row of the photodiodes located nearest to the horizontal charge transfer path HCCD are transferred to the horizontal charge transfer path HCCD.

When the vertical synchronizing signal VD is high (from time $t_{10}$ to time $t_{11}$), the horizontal charge transfer path HCCD horizontally transfers the pixel signals in synchronism with the drive signals $\Phi_{H1}$ and $\Phi_{H2}$ conforming to the two-phase drive system, and the transferred pixel signals are outputted chronologically through an output amplifier AMP.

Upon completion of reading the pixel signals equivalent to the one row, the same operation as the operation performed from time $t_8$ to time $t_{11}$ excluding the operation by the field shift signal $\Phi_F$ is performed from time $t_{11}$ to time $t_{12}$, thereby reading the pixel signals equivalent to a next one row. Similarly, this operation is repeated until all the pixel signals corresponding to the even field are read. The operation of reading a frame of pixel signals is completed at time $t_{13}$.

Thus all the vertical charge transfer paths 1 to m are set to the level of potential barrier by causing all the drive signals $\Phi_{V1}$ to $\Phi_{V4}$ to go low uniformly during the period $t_2$. As a result, as is apparent from the embodiments illustrated in FIGS. 3 and 4, not only the smear components introduced into the vertical charge transfer paths 1 to m are remarkably reduced, but also the smear components introduced into the pixel signals are made uniform for every field, and the flicker introduced into the reproduced image is significantly reduced. Since the smear components introduced into the vertical charge transfer paths during the exposure is small in absolute terms, the field scanning operation can be performed immediately after the completion of the exposure, which permits a high-speed imaging operation.

While the drive signal $\Phi_{V1}$ to $\Phi_{V4}$ are low during the exposure in the present embodiment, the level of these drive signals is not limited thereto but may be any appropriate voltage level to reduce the flicker as long as that voltage level is uniform during the exposure. However, if the vertical charge transfer paths are set to a comparatively low potential level during the exposure, the smear components will be introduced. In the present embodiment, it is effective to perform the so-called "dummy scanning" for discharging the unnecessary charge immediately after the exposure and then the field scanning operation to improve the dynamic range, etc.

Figure 9:
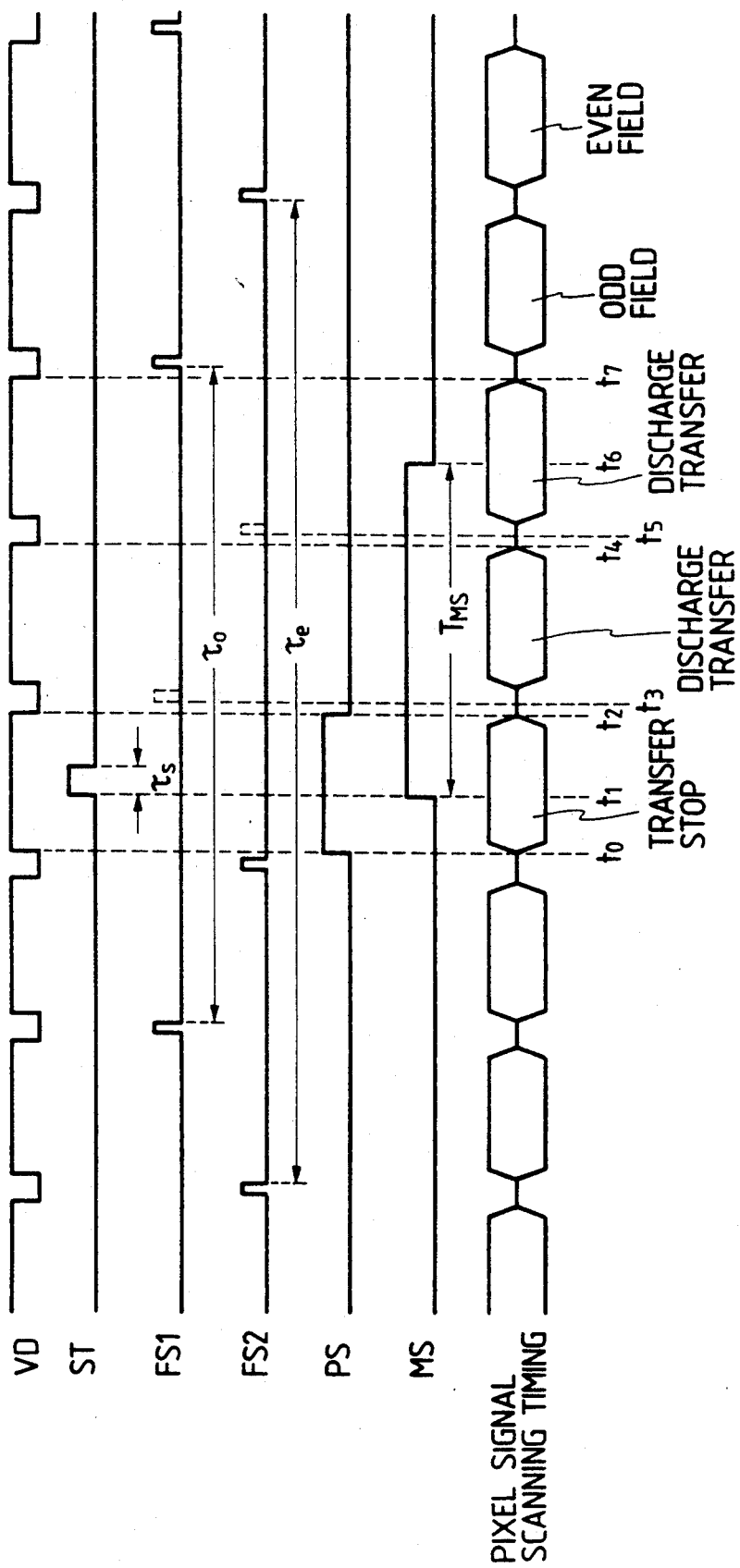
FIG. 9 illustrates the timing chart of a driving method for another embodiment of the present invention.

Another embodiment will now be described with reference to the timing chart illustrated in FIG. 9. In FIG. 9, reference character VD designates a vertical synchronizing signal; ST, an exposure interval; PS, a period for masking the drive signals $\Phi_{V1}$ to $\Phi_{V4}$ to be applied to each vertical charge transfer path; FS1, a field shifting operation timing at an odd field scanning start time; and FS2, a field shifting operation timing at an even field scanning start time.

The present embodiment reduces not only the flicker caused by the introduction of smear components but also the flicker caused by dark current regularly generated from the semiconductor substrate.

Since each field scanning start time is staggered, a period $\tau_e$ between the exposure completion time and the even field scanning start is longer than a period $\tau_0$ between the exposure completion time and the odd field scanning start, making the pixel signals corresponding to the even field more susceptible to the adverse effect of the dark current. There have been some cases where the dark current is responsible for the flicker. Thus, the present embodiment attempts, in addition to the processing of the first embodiment, to reduce dark current-induced flicker by controlling the field shifting operation timing so that the adverse effect of the dark current can be distributed uniformly to each field.

The control method will be described with reference to FIG. 9.

Figure 10:
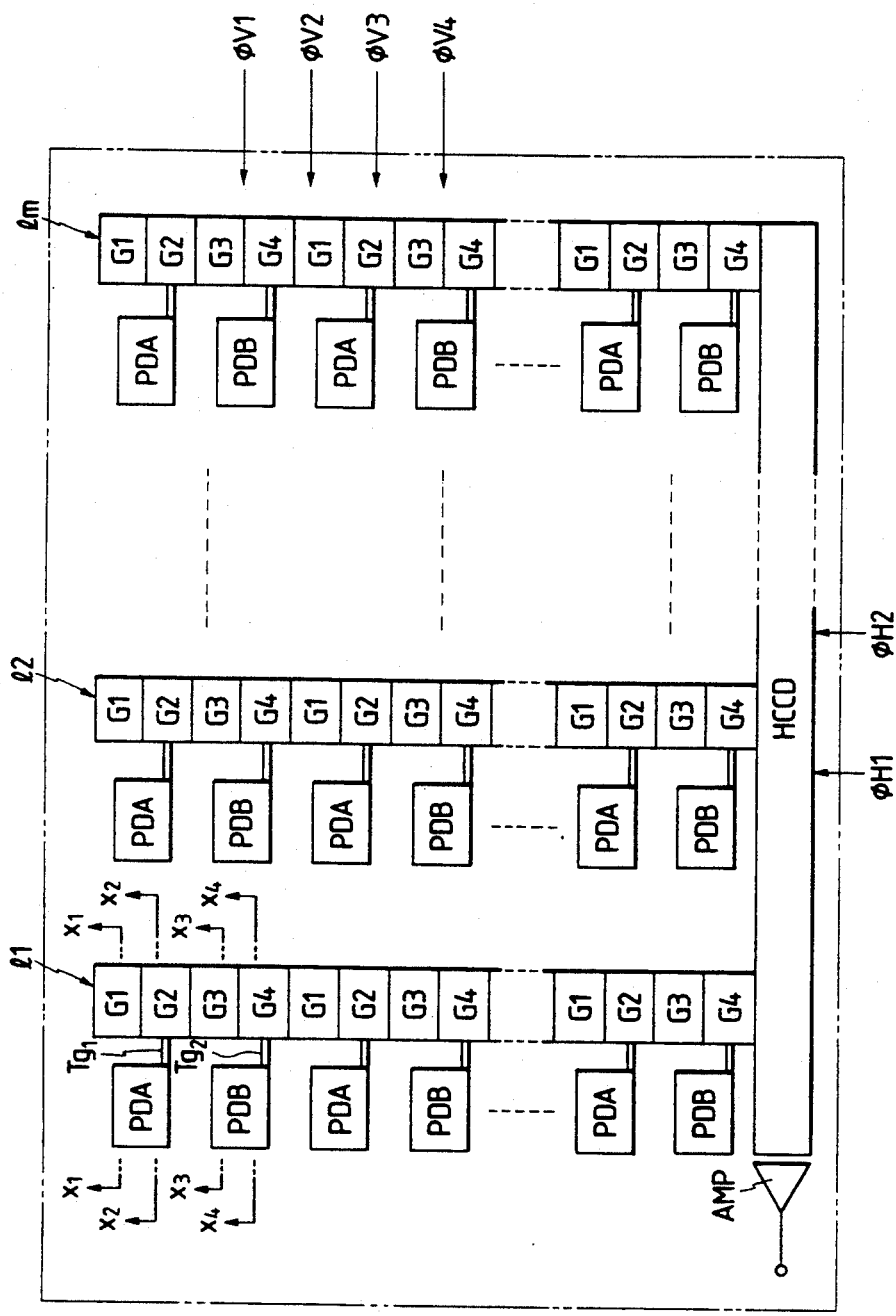
FIG. 10 illustrates a circuit diagram for a charge-coupled solid-state imaging device which uses the conventional driving method and the driving methods for the embodiments of the present invention.
Figure 11:
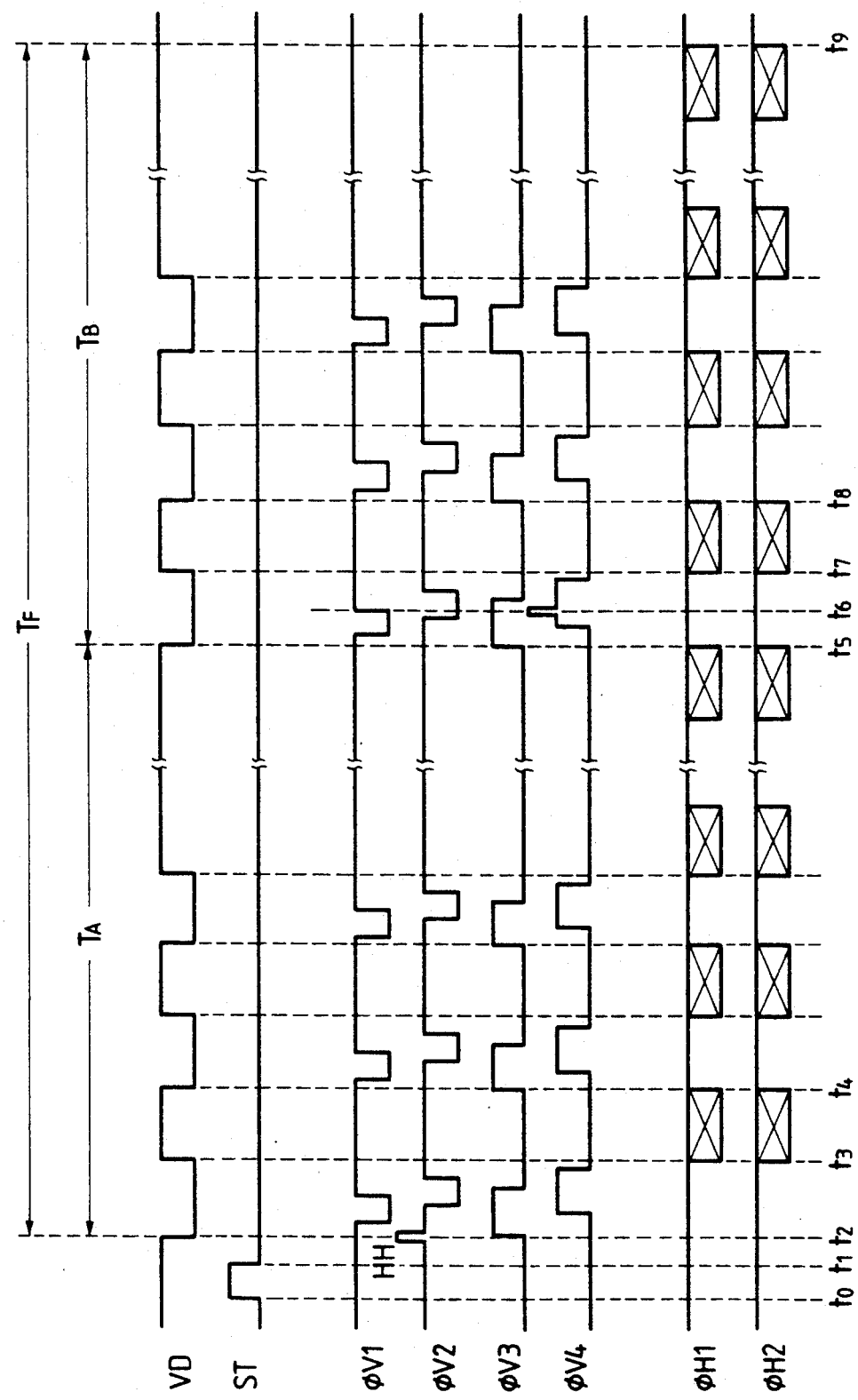
FIG. 11 illustrates the timing chart of the conventional driving method.

The construction and circuit structure of both the camera and the charge-coupled solid-state imaging device are the same as those illustrated in FIGS. 7 and 10, respectively.

When the shutter release button 7 has been pressed at a certain timing, at time $t_0$ when the vertical synchronizing signal VD goes low immediately after pressing the shutter release button 7, the mask signal PS that has been supplied from the synchronizing signal generating circuit 8 to the drive circuit 9 goes high. This mask signal PS sets all the drive signals $\Phi_{V1}$ to $\Phi_{V4}$ of the vertical charge transfer paths 1 to m to a uniform level for stopping the transfer operation. In addition, during the interval $\tau_s$ in which the shutter mechanism is opened for exposure, the potential levels of the vertical change transfer paths 1 to m are made uniform.

Further, a first mask signal MS (transferred from the synchronizing signal generating circuit 8 to the drive circuit 9) goes high in synchronism with the exposure start time $t_1$. A second mask signal MS has a function of not superimposing the field shift signal $\Phi_F$ over the drive signal only when it is high. The drive circuit 9 is operated in accordance with these mask signals MS.

Then, upon completion of the exposure, the mask signal PS goes low in synchronism with the vertical synchronizing signal VD going low immediately thereafter (at time $t_2$), and causes the field scanning operation to be started by the drive signals $\Phi_{V1}$ to $\Phi_{V4}$, $\Phi_{H1}$ and $\Phi_{H2}$. However, at time $t_3$ in which the field shifting operation (see FS1) for scanning the odd field must be started, the field shifting operation is prohibited since the mask signal MS is high. Thus the pixel signals are transferred by the vertical charge transfer paths 1 to m and the horizontal charge transfer path HCCD while held at the photodiodes PDA and PDB. As a result, the unnecessary charge in the vertical charge transfer paths 1 to m and the horizontal charge transfer path HCCD is discharged while the pixel signals corresponding to the odd field remain held at each photodiode PDA.

Then, upon completion of the transfer operation for discharging the unnecessary charge (at time $t_4$), the odd field scanning operation will be started. However, the field shift signal $\Phi_F$ to be generated at time $t_5$ is not generated due to the mask signal MS being high. As a result, the same operation as from time $t_2$ to time $t_4$ is performed from time $t_4$ to time $t_7$. Specifically, only the operation for discharging the unnecessary charge in the vertical charge transfer paths 1 to m and the horizontal charge transfer path HCCD is performed while the pixel signals corresponding to the even field remain held at each photodiode PDB.

Since the second mask signal MS goes high only during a period $T_{MS}$ equivalent to two cycles of the vertical synchronizing signal VD, the second mask signal MS goes low at, e.g., time $t_6$ in FIG. 9. Thus, open completion of the two rounds of discharging operation up to time $t_7$, the normal field scanning operation will be started from the next operation cycle (from time $t_7$).

The field scanning operation according to the control thus described causes the field shifting operation not only to each photodiode PDA corresponding to the odd field to stop for the period $\tau_0$ in FIG. 9 but also to each photodiode PDB corresponding to the even field to stop for the period $\tau_e$ in FIG. 9, so that both periods are made equal to each other. This, in turn, makes the dark current affect the pixel signals of each field uniform which significantly contributes to reducing the flicker conventionally caused by the dark current. At the same time, the two rounds of discharge operation up to the normal field scanning operation start contributes to remarkably reduce the flicker attributable to the unnecessary charge introduced into the vertical charge transfer paths and the horizontal charge transfer path.

As described in the foregoing, according to the embodiments of the present invention, the potential levels of all the vertical charge transfer paths are made uniform while the optical image is being exposed. This allows the effect of the smear components on the pixel signals corresponding to the respective fields to be uniform which provides the reproduced image with a very small amount of flicker.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of driving a charge-coupled solid-state imaging device of an interline transfer type, comprising the steps of:

imaging an optical image in a light receiving region of the imaging device, said light receiving region comprising a plurality of photoelectric conversion elements with each of said photoelectric conversion elements corresponding to one of a plurality of pixels, said photoelectric conversion elements arranged in rows and columns of a matrix form and a plurality of vertical change transfer paths with each of said vertical charge transfer paths adjacent to a portion of said photoelectric conversion elements arranged in each of said columns;

storing a pixel signal of said optical image in each of said photoelectric conversion elements from said step of imaging;

field shifting said pixel signal from each of said photoelectric conversion elements to a transfer element for one of said vertical charge transfer paths adjacent thereto;

transferring said pixel signal to a transfer electrode disposed on each of said vertical charge transfer paths in synchronism with a first predetermined drive signal while said optical image is being exposed to read said pixel signal; and driving the potential levels for said transfer elements of each of said vertical charge transfer paths to be uniform in response to said first predetermined drive signal.

2. The method according to claim 1, further comprising the steps of:

processing said pixel signal from said step of storing in response to a second predetermined drive signal; and recording said pixel signal processed by said step of processing on a recording medium.

3. A system of driving a charge-coupled solid-state imaging device of an interline transfer type, comprising:

a light receiving region of the imaging device comprising a plurality of photoelectric conversion elements with each of said photoelectric conversion elements corresponding to one of a plurality of pixels, said photoelectric conversion elements arranged in rows and columns of a matrix form and a plurality of vertical charge transfer paths with each of said vertical charge transfer paths adjacent to a portion of said photoelectric conversion elements arranged in each of said columns;

optical means for imaging an optical image in said light receiving region;

storing means for storing a pixel signal of said optical image in each of said photoelectric conversion elements from said optical means;

controlling means for field-shifting said pixel signal from each of said photoelectric conversion elements to a transfer element for one of said vertical charge transfer paths adjacent thereto;

synchronizing means for transferring said pixel signal to a transfer electrode disposed on each of said vertical charge transfer paths in synchronism with a predetermined drive signal while said optical image is being exposed to read said pixel signal; and driving means for driving the potential levels for said transfer elements of each of said vertical charge transfer paths to be uniform in response to said predetermined drive signal.

4. The system according to claim 3, further comprising:

signal processing means for processing said pixel signal from said storing means in response to said synchronizing means; and recording means for recording the processed signals from said signal processing means on a recording medium.

5. The system according to claim 3, wherein said optical means comprises an imaging lens, a diaphragm mechanism, a shutter mechanism and a charge-coupled solid-state imaging device.

6. The system according to claim 3, wherein said controlling means comprises a microprocessor.

7. The system according to claim 3, wherein said storing means comprises a sample hold circuit for sample-holding said pixel signal outputted from said optical means at a point sequential read timing.

8. The system according to claim 4, wherein said signal processing means comprises white balance adjusting means and $\gamma$ correcting means.

9. A method of driving a charge-coupled solid-state imaging device of an interline transfer type, comprising the steps of:

imaging an optical image in a light receiving region of the imaging device, said light receiving region comprising a plurality of photoelectric conversion elements with each of said photoelectric conversion elements corresponding to one of a plurality of pixels, said photoelectric conversion elements arranged in rows and columns of a matrix form and a plurality of vertical charge transfer paths with each of said vertical charge transfer paths adjacent to a portion of said photoelectric conversion elements arranged in each of said columns;

developing vertical driving signals, horizontal driving signals and a field signal;

storing a pixel signal of said optical image in each of said photoelectric conversion elements in response to said horizontal and vertical driving signals;

field-shifting said pixel signal from each of said photoelectric conversion elements to a transfer element for one of said vertical charge transfer paths adjacent thereto in response to said field signal;

transferring said pixel signal to a transfer electrode disposed on each of said vertical charge transfer paths in synchronism with said vertical driving signals while said optical image is being exposed to read said pixel signals; and forcing said vertical driving signals to a level which uniformly drives the potential levels for said transfer elements of each of said vertical charge transfer paths.

10. The method according to claim 9, further comprising the steps of:

processing said pixel signal from said step of storing in response to a process synchronizing signal; and recording said pixel signal processed by said step of processing on a recording medium in response to a record synchronizing signal and a record controlled signal.

11. The method according to claim 9, wherein said vertical driving signals comprise first, second, third and fourth vertical driving signals and said horizontal driving signals comprise first and second horizontal driving signals.

12. A system of driving a charge-coupled solid-state imaging device of an interline transfer type, comprising:

a light receiving region of the imaging device comprising a plurality of photoelectric conversion elements with each of said photoelectric conversion elements corresponding to one of a plurality of pixels, said photoelectric conversion elements arranged in rows and columns of a matrix form and a plurality of vertical charge transfer paths with each of said vertical charge transfer paths adjacent to a portion of said photoelectric conversion elements arranged in each of said columns;

signal developing means for developing vertical driving signals, horizontal driving signals and a field signal;

storing means for storing a pixel signal of said optical image in each of said photoelectric conversion elements in response to said horizontal and vertical driving signals;

controlling means for field-shifting said pixel signal from each of said photoelectric conversion elements to a transfer element for one of said vertical charge transfer paths adjacent thereto in response to said field signal;

synchronizing means for transferring said pixel signal to a transfer electrode disposed on each of said vertical charge transfer paths in synchronism with said vertical driving signals while said optical image is being exposed to read said pixel signal; and driving means for forming said vertical driving signals to a level which uniformly drives the potential levels for said transfer elements of each of said vertical charge transfer paths.

13. The system according to claim 12, further comprising:

processing means for processing said pixel signal from said storing means in response to a process synchronizing signal from said synchronizing means; and recording means for recording the processing pixel signal from said processing means on a recording medium in response to a record synchronizing signal from said synchronizing means and a record controlling signal from said controlling means.

14. The system according to claim 12, wherein said vertical driving signals comprise first, second, third and fourth vertical driving signals and said horizontal driving signals comprise first and second horizontal driving signals.

15. The system according to claim 12, wherein said optical means comprises an imaging lens, a diaphragm mechanism, a shutter mechanism and a charge-coupled solid-state imaging device.

16. The system according to claim 12, wherein said controlling means comprises a microprocessor.

17. The system according to claim 12, wherein said storing means comprises a sample hold circuit for sample holding said pixel signal outputted from said optical means at a point sequential read timing which synchronizes said horizontal and vertical driving signals.

18. The system according to claim 12, wherein said signal processing means comprises white balance adjusting means and $\gamma$ correcting means.

* * * * *

UNITED STATES PATENT AND TRADEMARK OFFICE
CERTIFICATE OF CORRECTION

PATENT NO. : 5,142,136

DATED : August 25, 1992

INVENTOR(S) : Yasumasa HASEGAWA, Tetsuo TOMA, Kazuya ODA and Masahiro KONISHI

It is certified that error appears in the above-identified patent and that said Letters Patent is hereby corrected as shown below:

On title page, item [75] change
   "Tetsuo TOME" to --Tetsuo TOMA--.

Signed and Sealed this

Fifth Day of October, 1993

Attest:

BRUCE LEHMAN

Attesting Officer

Commissioner of Patents and Trademarks